(12) United States Patent
Jurisch et al.

(10) Patent No.: US 11,892,474 B2
(45) Date of Patent: Feb. 6, 2024

(54) UNIVERSAL MEASUREMENT INPUT FOR CONNECTING A SMALL SIGNAL TRANSFORMER AND ELECTRICAL DEVICE WITH SUCH A MEASUREMENT INPUT

(71) Applicant: Siemens Aktiengesellschaft, Munich (DE)

(72) Inventors: Andreas Jurisch, Schwante (DE); Stefan Werben, Lauf a.d.P. (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 17/738,266

(22) Filed: May 6, 2022

(65) Prior Publication Data
US 2022/0357365 A1 Nov. 10, 2022

(30) Foreign Application Priority Data
May 6, 2021 (EP) .................................... 21172444

(51) Int. Cl.
*G01R 15/18* (2006.01)
(52) U.S. Cl.
CPC .................................. *G01R 15/181* (2013.01)
(58) Field of Classification Search
CPC .. G01R 15/181; G01R 19/2509; G01R 31/62; G01R 1/0416; G01R 23/165
USPC ......................................................... 324/127
See application file for complete search history.

(56) References Cited

U.S. PATENT DOCUMENTS

| | | | | |
|---|---|---|---|---|
| 4,695,792 A | * | 9/1987 | Roy | G01R 23/165 |
| | | | | 455/340 |
| 9,917,662 B2 | * | 3/2018 | Jurisch | H04B 1/16 |
| 2006/0232264 A1 | * | 10/2006 | Jurisch | G01R 15/18 |
| | | | | 324/142 |
| 2016/0285381 A1 | * | 9/2016 | Lai | G01R 31/42 |
| 2018/0054337 A1 | * | 2/2018 | Khoury | H04L 27/06 |
| 2019/0079117 A1 | * | 3/2019 | Hurwitz | G01R 19/2509 |
| 2019/0383859 A1 | * | 12/2019 | Hurwitz | G01R 15/181 |

FOREIGN PATENT DOCUMENTS

DE 10346356 A1 5/2005

* cited by examiner

*Primary Examiner* — Tung X Nguyen
*Assistant Examiner* — Robert P Alejnikov, Jr.
(74) *Attorney, Agent, or Firm* — Laurence A. Greenberg; Werner H. Stemer; Ralph E. Locher (57) ABSTRACT

A universal measurement input for connecting a small signal transformer to an electrical device includes an electrical input for connecting a connection line of the small signal transformer, an electrical output for outputting a measurement signal to the electrical device, and a correction element having a digital filter with a filter transfer function adapted to the small signal transformer. In order to provide a measurement input with which all possible types of small signal transformers can be connected to an electrical device and which thus reduces the device variety of measurement inputs which are to be provided, the filter transfer function of the correction element is defined by a parameter set to be variably preset specifically for the small signal transformer. An electrical device with the measurement input is also provided.

14 Claims, 5 Drawing Sheets

UNIVERSAL MEASUREMENT INPUT FOR CONNECTING A SMALL SIGNAL TRANSFORMER AND ELECTRICAL DEVICE WITH SUCH A MEASUREMENT INPUT

CROSS-REFERENCE TO RELATED APPLICATION

This application claims the priority, under 35 U.S.C. § 119, of European Patent Application EP 21172444.8, filed May 6, 2021; the prior application is herewith incorporated by reference in its entirety.

FIELD AND BACKGROUND OF THE INVENTION

The invention relates to a measurement input for connecting a small signal transformer to an electrical device with an electrical input for connecting a connection line of the small signal transformer, an electrical output for outputting a measurement signal to the electrical device, and a correction element which has a digital filter having a filter transfer function adapted for the small signal transformer.

The invention also relates to an electrical device with such a measurement input.

Electrical devices which are in use today, for example automation, measurement, control or protection devices of a technical system (e.g. of an energy supply network) usually have one or a plurality of measurement inputs to which a secondary side of transformers or sensors can be connected, in order to be able to detect measured variables such as currents or voltages of the technical system. In that case, those measurement inputs are usually adapted specifically for the type and the special configuration of the transformer. For decades, inductive transformers were common for both current measurement and voltage measurement. The rise of so-called small signal transformers (also referred to as "low power instrument transformer" LPIT) which are configured according to the standard IEC 61869, for example, is resulting in a significant increase in the number of new types of sensors and thus in the effort to provide suitable measurement inputs. Examples of small signal transformers are Rogowski coils, inductive transformers with an integrated load, capacitive dividers, resistive dividers and compensated RC dividers. Furthermore, CR dividers with a passive integrator (see IEC 61869-11 Annex 11C, image 11C.1, for example) or a simple measuring capacitor for displacement current measurement (so called "field probes") can be used for voltage measurement. In addition to the passive small signal transformers described in IEC 61869-10, sensors can also be used for current measurement which are based on the use of the magnetoresistive effect or the Hall effect. In the case of those sensors, a distinction is, in turn, made between direct imaging and compensation types.

If a device manufacturer wanted to offer for each type of sensor its own specific measurement input, a multiplicity of different assemblies would have to be developed and provided, in order to be able to cover all possible combinations of sensor types and sensor constructions.

For comparison, it should be mentioned that for conventional inductive transformers, one individual standardized measurement input is sufficient in order to ensure compatibility between the current or voltage transformers and the respective device signal inputs. There exist different types of current sensors (for example Rogowski coils, low power current transformers ("low power CT's") with an integrated load resistor) and different types of voltage sensors (capacitive dividers, resistive dividers, compensated RC dividers, field probes and CR dividers with a passive integrator) for the new small signal transformers. Each of those types of sensors can be configured for different load impedances and each of those variants would require its own measurement input, so that a multiplicity of different measurement inputs would have to be present in order to cover each of those variants.

A voltage input for connecting a small signal transformer in the form of a capacitive divider is known from German Patent Application DE 103 46 356 A1, corresponding to U.S. Pat. No. 7,489,122. A filter with a correction function inverse to the transfer function is used for correcting a transfer function of the capacitive divider. The filter can be bridged in order to also be able to connect the known measurement input to a conventional inductive transformer.

SUMMARY OF THE INVENTION

It is accordingly an object of the invention to provide a universal measurement input for connecting a small signal transformer, and an electrical device with such a measurement input, which overcome the hereinafore-mentioned disadvantages of the heretofore-known inputs and devices of this general type and with which all possible types of small signal transformers, in particular small signal transformers which are configured according to the standard IEC 61869, can be connected to an electrical device and thus the device variety of measurement inputs which are to be provided can be reduced.

With the foregoing and other objects in view there is provided, in accordance with the invention, a generic measurement input, in which the filter transfer function of the correction element is defined by a parameter set, and the parameter set can be variably preset specifically for the small signal transformer.

The advantage of the measurement input according to the invention lies in the fact that the adaptation virtually takes place through a correction filter, the transfer function of which can be specified variably by using a parameter set. The measurement input can therefore be universally specifically adapted for each of the different types of sensors in a simple manner through the parameter set. In this case, the parameter set can include parameters which can be considered for defining the filter transfer function. Examples of such parameters are the properties of the connected small signal transformer, possibly adapters which are used and the connection lines. These properties of the sensors can be described, for example, for current sensors with the rated values specified in table 1004 "Designation of a passive CT" of IEC 61869-10. For voltage sensors, these properties can be described with the rated values from table 1106 "Designation of a passive LPCT" of IEC 61869-11. Alternatively, a description of the properties of a small signal transformer can take place by specifying the values of the equivalent circuit diagram of the sensors, adapters and cables. Finally, the required filter transfer function can be determined from the parameters if the desired resulting total transfer function is known.

According to one advantageous embodiment, provision can be made for the parameter set to be able to be preset specifically for different types of small signal transformers on one hand for current measurement and on the other hand for voltage measurement.

One and the same measurement input can therefore be used variably not only for measuring current or voltage signals, but rather it can—depending on the preset parameter set—be used both for measuring currents and voltages, without a different hardware assembly having to be provided for this purpose.

One further advantageous embodiment makes provision for the filter transfer function of the correction element to be configured for compensating a sensor path transfer function of a transfer path formed by the small signal transformer, the connection line and at least one assembly of the measurement input.

According to this embodiment, the accuracy of the measurement is increased as a result of the correction not only being carried out with regard to a transfer function of the small signal transformer. In fact, the connection line with which the small signal transformer is connected to the measurement input and substantial assemblies of the measurement input itself are also incorporated into the correction. The latter components may, in fact, also have significant influence on the transfer of the measurement signals. With regard to the connection lines, aspects of the connection technology (connection of sensor to a device terminal) can in particular also have an influence on the required correction: for example cables of different lengths, different types of cables and diverse adapters can have significant influence on the required correction.

One further advantageous embodiment of the measurement input according to the invention additionally makes provision for the filter transfer function to be configured in such a way that a total transfer function resulting from the superposition of the sensor path transfer function and the filter transfer function corresponds to a transfer characteristic which would be present when using a (conventional) inductive transformer as a sensor.

This makes it possible to ensure that the measurement input connected to a small signal transformer behaves, from the perspective of the electrical device, as if a "normal" inductive transformer were connected. All of the functions using the measurement signal can therefore continue to be used without additional adaptations.

In the context of a further advantageous embodiment, provision can be made for the pole points of the filter transfer function to be defined depending on the position of the zero points of the sensor path transfer function and the zero points of the filter transfer function depending on the position of the pole points of the sensor path transfer function.

This makes it possible to generate the filter transfer function used for correction in a particularly advantageous manner, since the zero points and pole points of the sensor path transfer function, which are easy to determine analytically, are used virtually as anchor points for determining the filter transfer function.

According to one further advantageous embodiment, provision is made for the sensor-specific parameter set to be stored in a data storage device in the context of a configuration of the measurement input.

Specifically, provision can be made in this respect for a sensor model describing the small signal transformer, a cable model describing the connection line and a measurement input model describing at least one assembly of the measurement input to be provided, from which the sensor-specific parameter set is derived, in the data storage device of the measurement input or in a configuration tool for configuration.

In this case, the respective models can represent a mathematical replication of the respective frequency-dependent transfer functions of the individual components. Each of the components is regarded as a block, for example as a so called "quadrupole" with its own properties, wherein the sensor path transfer function is formed by linking the individual blocks. The parameter set can finally be derived from this, which serves to define the filter transfer function.

One further advantageous embodiment makes provision for an impedance matching circuit, which is configured as a voltage divider, to be connected downstream of the electrical input.

As a result, the measurement input can be configured in such a way that a required input impedance is provided. For example, in the standard IEC 61869-10 or IEC 61869-11, input impedances of measurement inputs are preset for small signal transformers which can be maintained by an impedance matching circuit of this type.

Provision can additionally be made for a signal conditioning unit, which can be switched between a first mode according to a low-pass characteristic or a PI controller and a second mode according to a proportional characteristic, to be connected downstream of the impedance matching circuit.

Adaptation of the measurement input for the type of small signal transformer can take place by way of the signal conditioning unit, in such a way that the filter transfer function can be configured in a simpler manner. A compression of the required dynamic range through the frequency additionally takes place, for example, by the transfer behavior of the signal conditioning unit compensating a large dynamic range of the frequency-dependent amplifications of the sensor path transfer function within the pass band of interest to a value which is as frequency-independent as possible. This is achieved in the case of sensors with differentiating behavior, for example with a low pass above the cut-off frequency of the low pass.

Specifically, provision can be made in this respect for the mode of the signal conditioning unit to be defined depending on the position of a zero point of the transfer function of the small signal transformer.

For this purpose, for example, provision can be made for the signal conditioning unit to operate in the first mode if the transfer function of the small signal transformer has a zero point at f=0 Hz, in order to compensate a differentiating characteristic of the transformer being used (e.g. Rogowski coil).

One further advantageous embodiment of the measurement input according to the invention makes provision for a programmable gain amplifier to be connected downstream of the signal conditioning unit.

As a result, the different amplifications of different small signal transformers can be adapted to the measuring range of the downstream A/D transformer. The amplification stages of the programmable gain amplifier are advantageously logarithmically staggered, in order to achieve optimal adaptation of the measurement input for the amplification of the small signal transformer. In other words, small signal transformers of different transmission ratios may exist (i.e. different secondary nominal values arise depending on a primary nominal current). In order to be able to map this, different measuring ranges/amplification switchovers are required which can be realized with the amplifier.

For digitizing the measurement signal, provision can finally be made for a scanning device or an A-D transformer to be connected downstream of the programmable gain amplifier.

With the objects of the invention in view, there is also provided an electrical device with at least one measurement input according to the invention. An electrical device of this type can, for example, be an automation, measurement, control or protection device of a technical system, for example of an energy supply network.

With regard to the device according to the invention, all of the statements made previously and hereinafter with respect to the measurement input according to the invention shall apply and vice versa in a corresponding manner, in particular, the device according to the invention can be operated with the measurement input in any embodiment or a combination of any embodiments. Also with regard to the advantages of the device according to the invention, reference is made to the advantages described for the measurement input according to the invention.

According to one advantageous embodiment of the electrical device, provision can be made for the electrical device, in addition to the at least one measurement input, to have at least one further measurement input for connecting an inductive transformer.

In particular, in the event that a characteristic of a "conventional" measurement input connected to an inductive transformer is reproduced with the measurement input connected to a small signal transformer, it can thus be ensured that all downstream device functions of the electrical device can operate without further adaptation and in the defined specifications to the type of transformer.

Other features which are considered as characteristic for the invention are set forth in the appended claims.

Although the invention is illustrated and described herein as embodied in a universal measurement input for connecting a small signal transformer, and an electrical device with such a measurement input, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
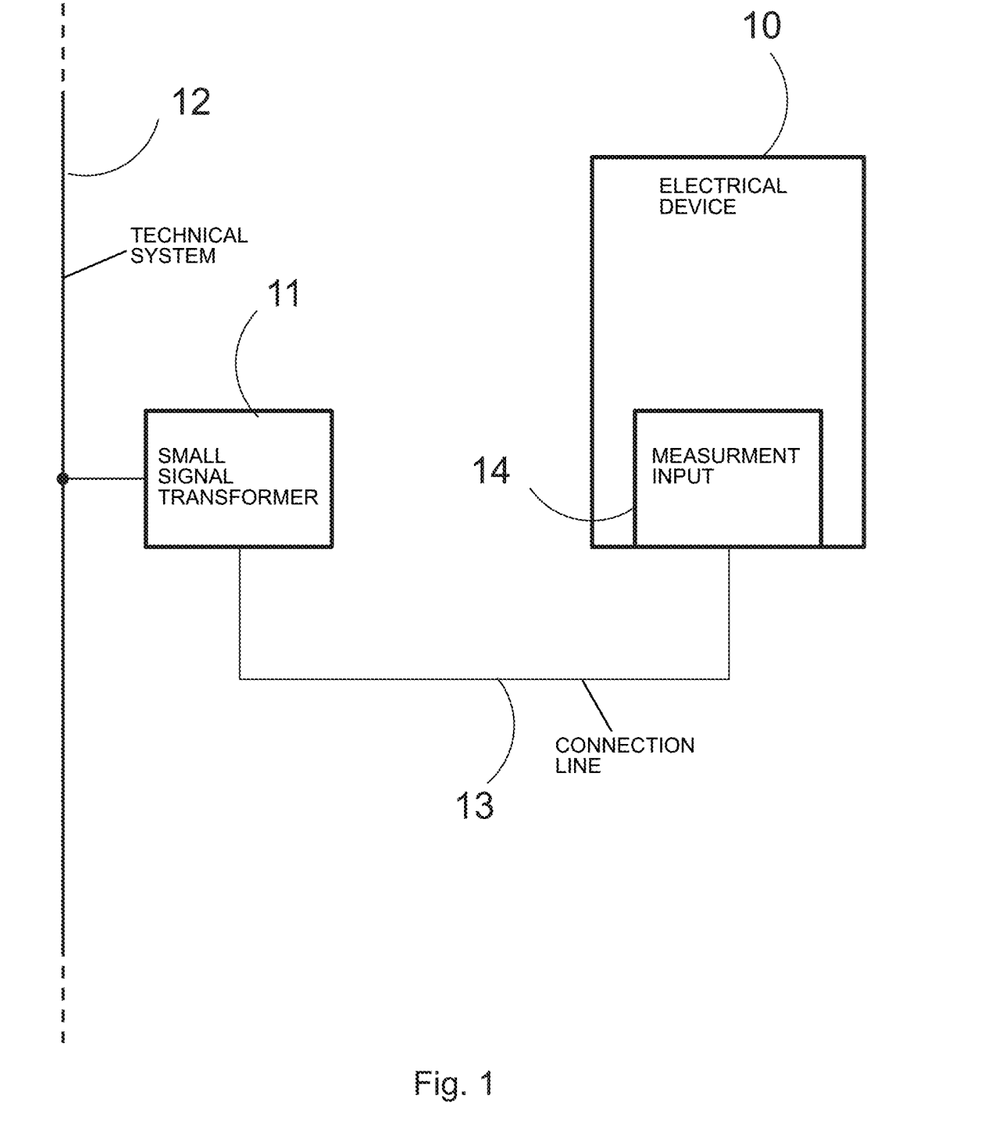
FIG. 1 is a block diagram of an electrical device connected to a technical system by a small signal transformer with a measurement input.

Referring now in detail to the figures of the drawings, in which units which are identical or correspond to one another are identified by the same reference numerals, and first, particularly, to FIG. 1 thereof, there is seen an electrical device 10 which can be an automation, measurement, control or protection device, for example. Devices of this type are usually used for observing, for controlling, for protecting or for monitoring technical systems. For this purpose, the devices are connected to the technical system through sensors with which measurement signals are recorded that specify the status of the technical system. The technical system can be an electrical energy supply network, for example. For monitoring an electrical energy supply network of this type, measurement signals of currents and voltages are usually recorded. While inductive transducers have long been used as sensors for this purpose, the use of small signal transducers is now becoming ever more widespread. Sensors which output a low electrical power at their output (in comparison to conventional inductive transformers) are regarded as small signal transducers. Examples of small signal transformers for measurements of currents or voltages are Rogowski coils, capacitive dividers, resistive dividers, compensated RC dividers, CR dividers with a passive integrator or low power current transformers with an integrated load. Small signal transformers of this type normally have a different transfer characteristic than the inductive transformers, which transpires in particular in areas of high and low frequencies.

In the example in FIG. 1, the electrical device 10 is connected to a technical system 12 through a small signal transformer 11. By way of example, the technical system 12 is an electrical energy supply network of which only one line is represented in FIG. 1 for the sake of clarity. The small signal transformer 11 is connected to a measurement input 14 of the electrical device 10 through a connection line 13, which can, for example, be a double shielded wire pair with a length (e.g. a few meters in medium voltage switching systems up to several 100m in high voltage switching systems) which is normal in technical systems (e.g. substations). The measurement input 14 can represent an integrated installation card of the electrical device 10 for this purpose, for example. Alternatively, however, it can also be a separate assembly which is disposed outside the device 10. The measurement input 14 is set up to interact with any small signal transformers. For this purpose, it has a digital filter, the transfer function of which compensates in a desired manner the characteristic of a sensor path transfer function formed from a small signal transformer 11, connection line 13 and at least one assembly of the measurement input 14.

Figure 2:
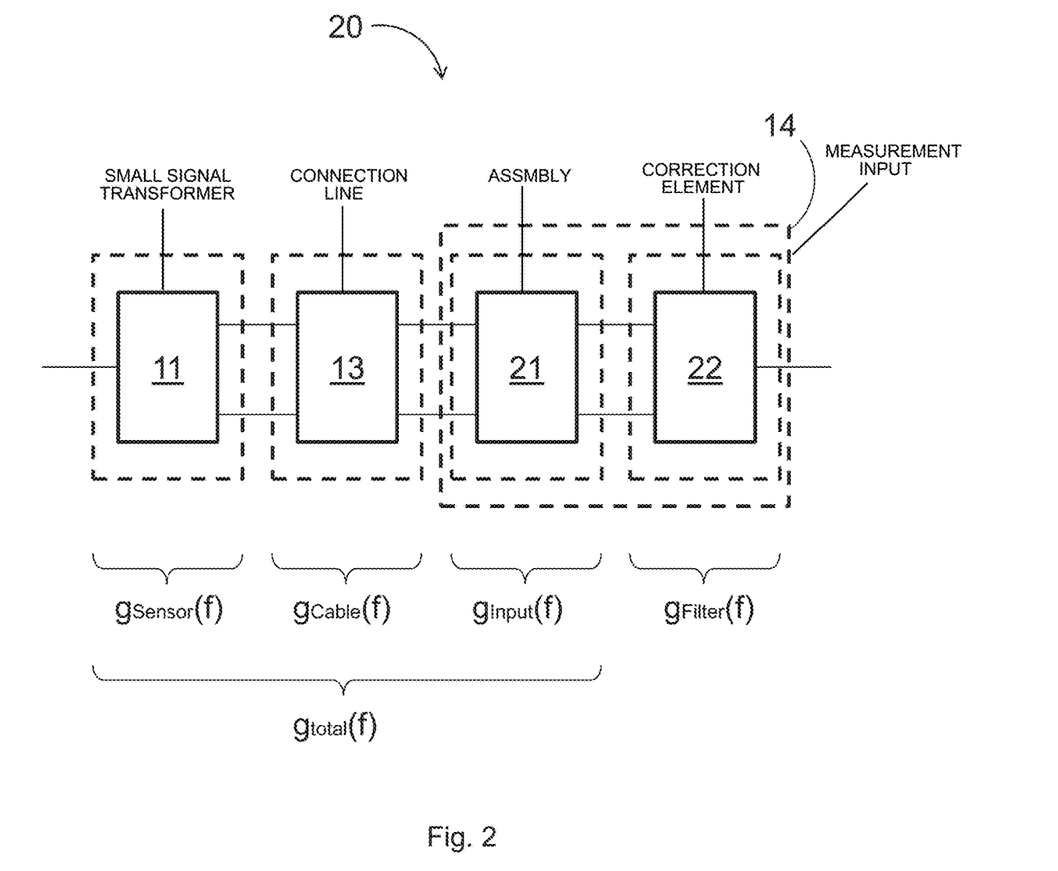
FIG. 2 is a block diagram of individual components of transfer functions of a measurement path.

For this purpose, FIG. 2 schematically shows the individual components of a measurement path 20 including their different transfer functions. The measurement path is composed of the small signal transformer 11, the connection line 13 and the measurement input 14, wherein the measurement input has at least one assembly 21 and a correction element 22 with the digital filter mentioned previously. In this case, the at least one assembly 21 of the measurement input 14 includes all analog circuits of the measurement input 14 up to an analog-to-digital conversion. These analog circuits are used for pre-processing (e.g. filtering, amplifying) the measurement signal.

Each of the components of the measurement path 20 possesses its own transfer function, i.e. in the frequency range a characteristic of how currents and voltages are transferred with respect to their amplitude (attenuation) and their phase angle (phase shift) depending on the frequency. Specifically, the small signal transformer 11 has a transfer function $g_{sensor}(f)$, the connection line 13 a transfer function $g_{cable}(f)$ and the at least one assembly 21 of the measurement input 14 a transfer function $g_{input}(f)$. These components together form a sensor path and have a sensor path transfer function $g_{total}(f)$ composed of the three individual transfer functions. The correction element 22 with the digital filter has a transfer function $g_{Filter}(f)$ which is used for correcting the sensor path transfer function, so that the characteristics of the individual components of the sensor path, for example type and construction of the small signal transformer, nominal termination impedance (design load) of the small signal transformer as well as type and length of the connection lines, do not affect the measurement result. In order to be able to use any small signal transformers with any connection lines as sensors for current or voltage measurement, the filter transfer function $g_{Filter}(f)$ can additionally be adapted as desired for the respective sensor path transfer function.

Figure 3:
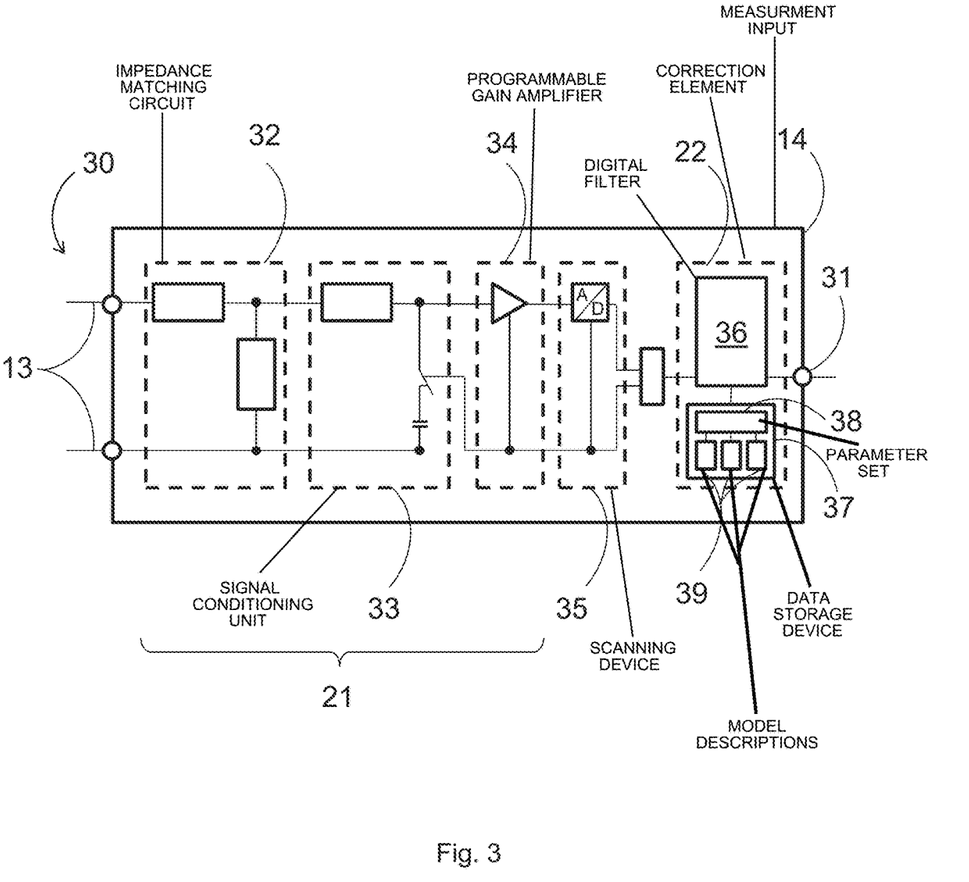
FIG. 3 is a block diagram of an exemplary embodiment of a measurement input.

FIG. 3 shows a schematic view of the measurement input 14. The measurement input 14 has an electrical input 30 and an electrical output 31. The electrical input 14 is set up for electrical connection with the connection lines 13, in order to connect the measurement input 14 to the small signal transformer. An impedance matching circuit 32, which is used for adapting the input impedance of the measurement input 14, is connected downstream of the electrical input 30. Input impedances for measurement inputs which are operated with small signal transformers are defined in the standard IEC 61869, for example. The impedance matching circuit 32 can be constructed as a resistive voltage divider and in this respect can have an upper resistance value of 1.8 MΩ and a lower resistance value of 200 kΩ, for example.

A signal conditioning unit 33 can be connected downstream of the impedance matching circuit 32. The signal conditioning unit 33 can be configured as a low-pass filter or PI controller, for example. A configuration as a low-pass filter can be an RC combination of a resistor and a capacitor, for example, which forms a first order low pass, the cutoff frequency of which is defined below the nominal frequency of the technical system. In the case of a configuration as a PI controller, an operational amplifier in an inverting basic circuit with a resistor from the input of the circuit to the inverting OPV input and a resistor parallel to a capacitor in the feedback branch can be used. The signal conditioning unit 33 can be used for limiting the frequency-dependent amplification of the analog signal chain within the used frequency range. The signal conditioning unit 33 can (for example through software which controls the measurement input) be switched between two modes, wherein the first mode has a low-pass characteristic or a PI characteristic and the second mode has a proportional characteristic. Switching between the two modes serves to compensate a differentiating behavior of a Rogowski coil already before the analog-to-digital conversion. In this case, the mode of the signal conditioning unit 33 can be defined depending on the position of a zero point of the transfer function $g_{sensor}(f)$ of the small signal transformer 11. If the transfer function $g_{sensor}(f)$ in the zero points-pole points representation has a zero point at a frequency of 0 Hz, as is the case with a Rogowski coil, for example, the signal conditioning unit 33 is operated in the first mode. This has the advantage that the downstream analog-to-digital converter can be operated with a high level of accuracy, since no or only a small modulation reserve of the AD transformer must be provided for transient pulse peaks of the Rogowski coil.

A programmable gain amplifier 34 (PGA) is connected downstream of the signal conditioning unit 33. This is used to raise the signal level in an adaptable manner. The amplification gPGA of the programmable gain amplifier can be set, for example, according to the following equation:

$$g_{PGA} = \frac{V_{IO-Inp-max}}{V_{ADC-max} \cdot g_{Div}}$$

-continued
$$V_{IO-Inp-max} = \sqrt{2} \cdot g_{SigChain}(f_n) \cdot X_{Nom} \cdot \text{Clip}$$

In this case, the following applies:

$g_{SigChain}(f_n)$: transfer function of the connected small signal transformer (including connection line) folded with the transfer function of the at least one correction element 22 of the measurement input 14 at the nominal frequency of the technical system;

$X_{Nom}$: nominal voltage or nominal current of the technical system (depending on the type of sensor);

Clip: ratio between the full-scale deflection and the nominal value of the voltage or of the current;

$V_{ADC-max}$: full-scale deflection of the input voltage of the analog-to-digital converter;

$g_{div}$: transmission ratio of the signal transfer chain; quotient of the output voltage of the signal transfer chain and the input signal applied in this case (current or voltage depending on the sensor) at nominal frequency.

A scanning device or analog-to-digital converter 35, which digitizes the measurement signal emitted from the amplifier 34 on the output side and submits it to the correction element 22 through an internal bus (see FIG. 2), is connected downstream of the programmable gain amplifier 34. In the example in FIG. 3, the impedance matching circuit 32, the signal conditioning unit 33 and the programmable gain amplifier 34 form the analog part of the measurement input 14 and thus the at least one assembly 21 according to FIG. 2.

The correction element 22 includes a digital filter 36 and a data storage device 37. In the data storage device 37, a parameter set 38 indicated schematically in FIG. 3 is provided which determines the filter transfer function $g_{Filter}(f)$ of the digital filter. In this case, the parameter set is variable and can be specifically adapted for the type and configuration of the small signal transformer 11, the connection line 13 and the at least one assembly 21 of the measurement input 14. For this purpose, model descriptions 39 are stored in the data storage device which analytically describe the transfer functions $g_{sensor}(f)$, $g_{Cable}(f)$ and $g_{Input}(f)$ of the individual components of the sensor transfer path. Alternatively, the model descriptions 39 can also be stored in a configuration tool, for example configuration software. The model descriptions specify the modeling of two poles or quadrupoles respectively with which the transfer functions of the components "small signal transformer," "connection line" and "assembly of the measurement input" can be described. These model descriptions fall back on equivalent circuits predefined for the respective types of small signal transformers, types of connection lines and types of assemblies of the measurement input and their parameters, in order to describe the frequency-dependent transfer behavior. In this case, the equivalent circuits of the individual quadrupoles are modelled, for example, in a chain matrix representation of a quadrupole using four individual transfer functions. In this case, the transfer functions of the chain matrix elements are determined in a known manner by comparing coefficients from the respective equivalent circuit of the quadrupole. Linking the individual modeled transfer functions makes it possible to determine the sensor path transfer function $g_{total}(f)$, the filter transfer function $g_{Filter}(f)$ being configured to correct it. The type of linking can take place, for example, by multiplying the chain matrices of the individual quadrupoles connected in series. The output voltage-to-input voltage or output voltage-to-input current transfer function (depending on the type of sensor) of the resulting quadrupole can then be formed in a known manner from the resulting chain matrix elements, at the specification of the transfer function of the load impedance of the quadrupole.

In this case, the transfer function $g_{result}(f)$ resulting from the superposition of the sensor path transfer function $g_{total}(f)$ and the filter transfer function $g_{Filter}(f)$ can be selected in such a way that it would correspond to a transfer characteristic which would be present when connecting a conventional inductive current or voltage transformer to a conventional measurement input. This makes it possible for evaluation functions, connected downstream of the measurement input 14, of the electrical device 10, which were previously configured for the use of inductive transformers and were adapted to their characteristics, to be maintained unchanged. Of course, every other form of the resulting transfer function is also possible, in such a way that completely flat courses of the resulting transfer function can also be realized, for example. For calculating the corrective filter transfer function using the sensor path transfer function, the sensor path transfer function is advantageously transformed using an eigenvalue calculation of the characteristic matrix of the transfer function polynomial into a product form (so called "zero, pole gain representation"). The pole points and zero points of the sensor path transfer function are sorted according to their frequency. Only pole points and zero points are considered which are within a frequency range which is of interest for correction (typically the frequency range from 0 Hz to half the scanning frequency of the AD transformer). In order to achieve a resulting total transfer function which is as flat as possible after the correction, zero points of the sensor path transfer function in the frequency range of interest are used as pole points in the filter transfer function and the pole points of the sensor path transfer function as zero points of the filter transfer function. The amplification ("gain") of the filter transfer function is selected in such a way that the product of the amplifications of the sensor path transfer function and the filter transfer function at nominal frequency corresponds to the desired value (e.g. 1.0 times nominal value). In order to adapt the filter transfer function to a preset reference characteristic of an inductive transformer, the pole points and zero points of the reference characteristic are inserted into the filter transfer function of the flat characteristic as additional product terms.

Figure 4:
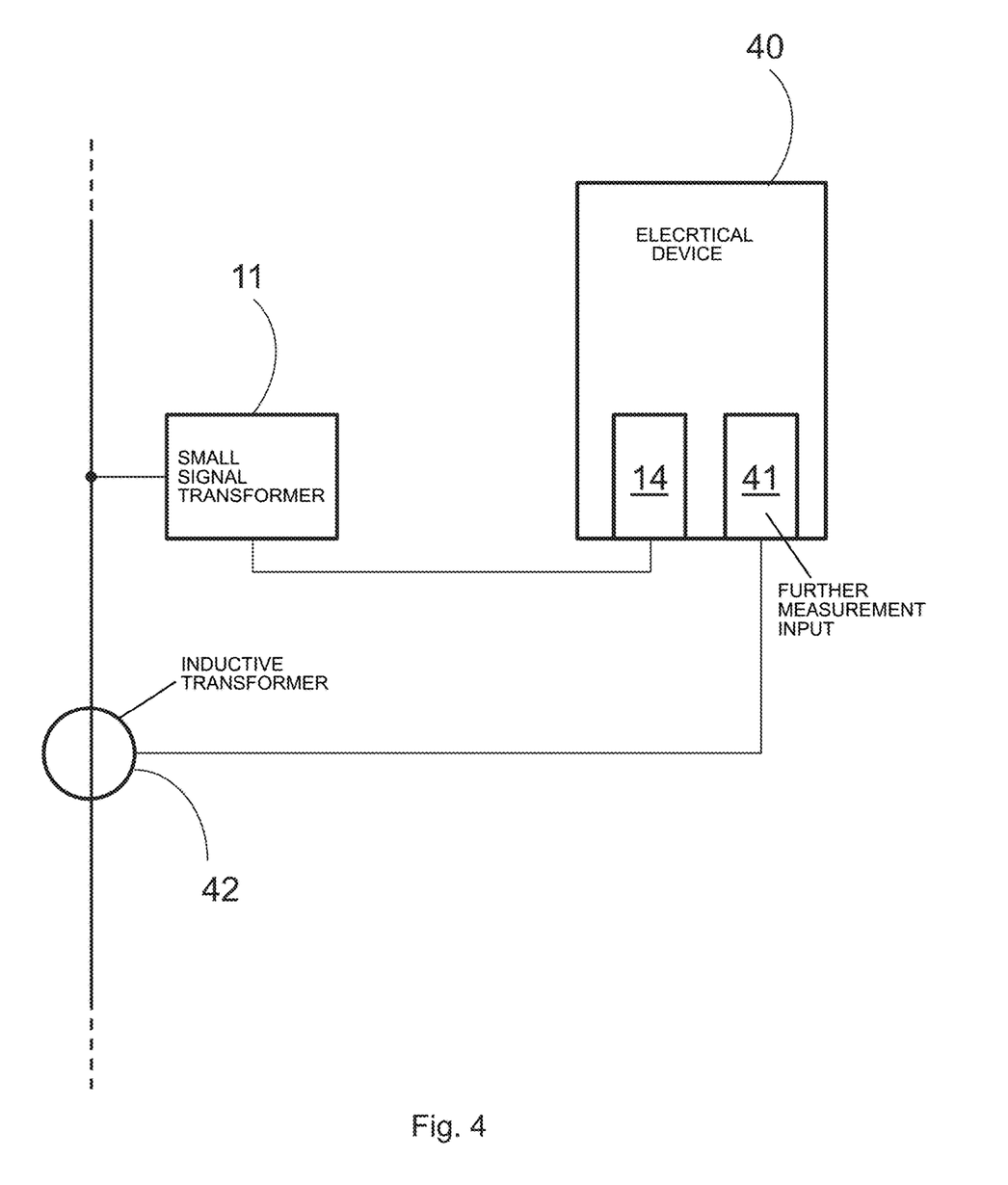
FIG. 4 is a block diagram of an electrical device connected to a technical system on one hand by a small signal transformer and on the other hand by an inductive transformer.

FIG. 4 shows an electrical device 40 which on one hand is connected to a small signal transformer 11 by a measurement input 14 and to an inductive transformer 42 by a further (conventional) measurement input 41. In particular in a mixed configuration of this type, it is advantageous if the resulting transfer function of the measurement input 14 is configured in such a way that it corresponds to the characteristic of a transfer path with an inductive transformer.

Figure 5:
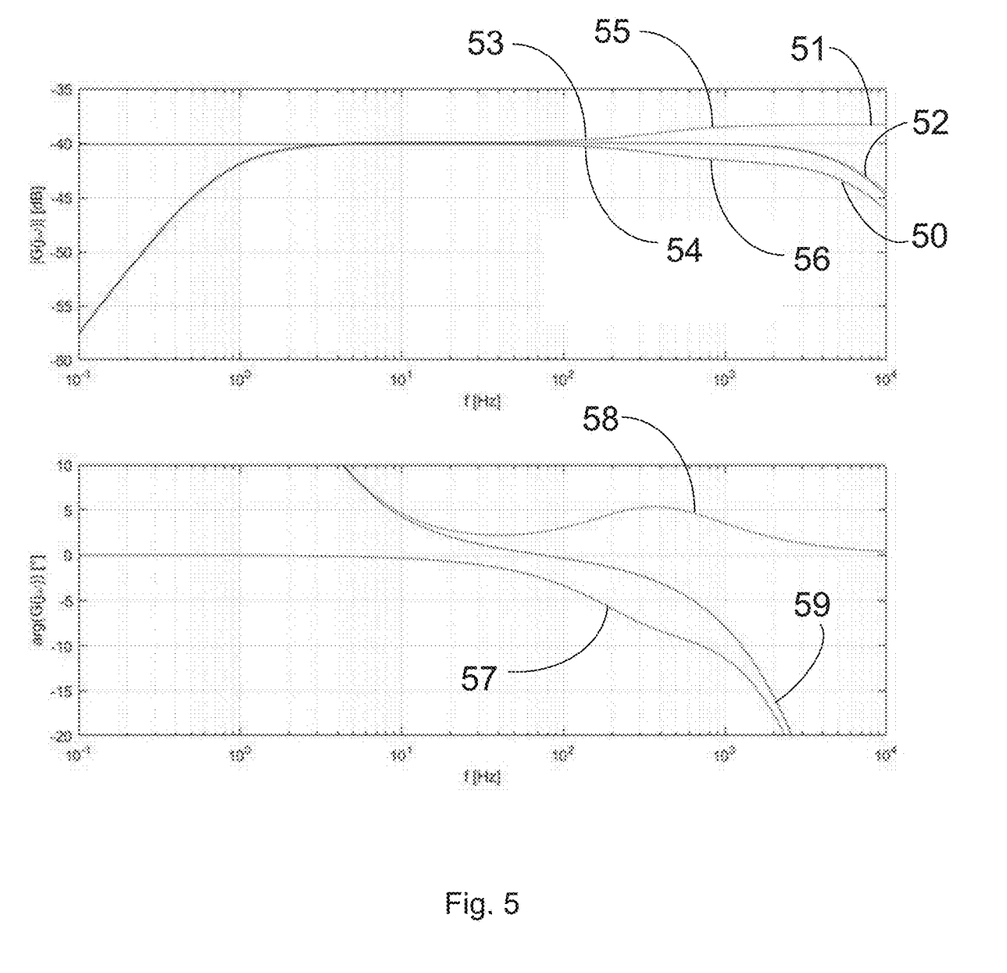
FIG. 5 includes diagrams showing examples of a sensor path transfer function and a filter transfer function.

Finally, FIG. 5 shows diagrams with exemplary courses of transfer functions when using a small signal transformer in the form of an RC divider for voltage measurement. In this case, the upper diagram shows the transfer functions of the amplitudes and the lower diagram shows the transfer function of the phase angle. In the upper diagram, it can be recognized that curve 50 is the sensor path transfer function $g_{total}(f)$ when using the RC divider. Curve 51 specifies the corrective filter transfer function $g_{Filter}(f)$ of the digital filter which must be used in order to achieve the desired resulting total transfer function $g_{result}(f)$, which is shown as curve 52. It can be recognized that in a zero points-pole points representation of the transfer function, dependencies must be created between the zero points and pole points of the filter transfer function $g_{Filter}(f)$ and the sensor path transfer function $g_{total}(f)$ for configuring the filter transfer function.

Provision can be made, for example, in a frequency range between 0 Hz and half the scanning frequency $f_a$ of the A-D transformer, for the pole points of the filter transfer function (e.g. point 53 in FIG. 5) to be at the zero points of the sensor path transfer function (e.g. point 54 in FIG. 5) and vice versa the zero points of the filter transfer function (e.g. point 55 in FIG. 5) to be at the pole points of the sensor path transfer function (e.g. point 56 in FIG. 5).

In the case of a Rogowski coil, a zero point of the sensor path transfer function at f=0 Hz is compensated with a pole point of the filter transfer function at a frequency which corresponds to a time constant of a conventional inductive current or voltage transformer.

In the case of other types of transformers in which no zero point at 0 Hz is present, an additional pole point is inserted in the filter transfer function at a frequency which corresponds to a time constant of a conventional inductive current or voltage transformer.

In the lower diagram, with regard to phase rotation, curve 57 specifies the sensor path transfer function in the case of a small signal transformer in the form of an RC divider, curve 58 the corrective filter transfer function and curve 59 the resulting total transfer function.

The measurement input 14 is configured to interact with any type of small signal transformer and to have the desired characteristic as a resulting transfer function. For this purpose, only the parameter set 38 present in the data storage device 37 must be adapted for the small signal transformer, as explained previously. This takes place in the context of a configuration. For this purpose, the required information regarding the individual transfer functions can be determined from the models 39 for the components of the measurement path. This can take place directly in the measurement input or in an external configuration tool. In the latter case, the model descriptions are stored in the configuration tool, instead of in the measurement input. The obtained parameter set also takes into account the transfer characteristic of the connection line, which in particular is determined from its type and length. The configuration can take place before starting up the measurement input. Default settings for different types and constructions of small signal transformers may also already be calculated and stored (for example in the data storage device of the measurement input), in such a way that merely a selection of the correct type of small signal transformer must take place for configuration.

Although the invention has been illustrated and described in greater detail previously by preferred exemplary embodiments, the invention is not limited by the disclosed examples and other variations can be derived from this by the person skilled in the art, without departing from the scope of protection of the subsequent claims.

The invention claimed is:

1. A measurement input for connecting a small signal transformer to an electrical device, the measurement input comprising:
    an electrical input for connecting a connection line of the small signal transformer;
    an electrical output for outputting a measurement signal to the electrical device; and
    a correction element having a digital filter with a filter transfer function adapted to the small signal transformer;
    the filter transfer function of the correction element being defined by a parameter set, the parameter set configured to be variably preset specifically for the small signal transformer, and the parameter set configured to be preset specifically for different types of small signal transformers for current measurement and for voltage measurement.

2. The measurement input according to claim 1, wherein the filter transfer function of said correction element is configured for compensating a sensor path transfer function of a transfer path formed by the small signal transformer, the connection line and at least one assembly of the measurement input.

3. The measurement input according to claim 2, wherein the filter transfer function is configured in such a way that a total transfer function resulting from a superposition of the sensor path transfer function and the filter transfer function corresponds to a transfer characteristic which would be present when using an inductive transformer as a sensor.

4. The measurement input according to claim 2, wherein pole points of the filter transfer function are defined depending on a position of zero points of the sensor path transfer function and zero points of the filter transfer function depending on a position of the pole points of the sensor path transfer function.

5. The measurement input according to claim 1, which further comprises a data storage device storing the parameter set in dependence on a configuration of the measurement input.

6. The measurement input according to claim 5, wherein said data storage device or a configuration tool for configuration has a sensor model describing the small signal transformer, a cable model describing the connection line and a measurement input model describing at least one assembly of the measurement input, from which the parameter set is derived.

7. The measurement input according to claim 1, which further comprises an impedance matching circuit configured as a voltage divider connected downstream of said electrical input.

8. The measurement input according to claim 7, which further comprises a signal conditioning unit connected downstream of said impedance matching circuit relative to said electrical input and configured to be switched between a first mode according to a low-pass characteristic or a PI controller and a second mode according to a proportional characteristic.

9. The measurement input according to claim 8, wherein the mode of said signal conditioning unit is defined in dependence on a position of a zero point of a transfer function of the small signal transformer.

10. The measurement input according to claim 9, which further comprises a programmable gain amplifier connected downstream of said signal conditioning unit relative to said electrical input.

11. The measurement input according to claim 10, which further comprises a scanning device connected downstream of said programmable gain amplifier relative to said electrical input.

12. An electrical device, comprising at least one measurement input according to claim 1.

13. The electrical device according to claim 12, wherein the electrical device is a measurement, control or protection device of a technical system.

14. The electrical device according to claim 12, wherein the electrical device has at least one further measurement input for connecting an inductive transformer, in addition to the at least one measurement input.

* * * * *